United States Patent
Lai

(10) Patent No.: US 7,473,927 B2
(45) Date of Patent: Jan. 6, 2009

(54) THIN FILM TRANSISTORS ARRAY AND PIXEL STRUCTURE

(75) Inventor: Han-Chung Lai, Taoyuan County (TW)

(73) Assignee: AU Optronics Corporation, Hsinchu (TW)

( * ) Notice: Subject to any disclaimer, the term of this patent is extended or adjusted under 35 U.S.C. 154(b) by 245 days.

(21) Appl. No.: 10/904,875

(22) Filed: Dec. 2, 2004

(65) Prior Publication Data

US 2006/0043370 A1 Mar. 2, 2006

(30) Foreign Application Priority Data

Aug. 26, 2004 (TW) ............... 93125452 A

(51) Int. Cl.
    *H01L 31/112* (2006.01)
(52) U.S. Cl. .......................... 257/71; 257/59
(58) Field of Classification Search .............. 257/72, 257/59, 70, 71
    See application file for complete search history.

(56) References Cited

U.S. PATENT DOCUMENTS 6,738,107 B2 * 5/2004 Nagase et al. ............. 349/39
6,777,709 B2   8/2004 Wu et al. .................... 257/59
7,095,469 B2 * 8/2006 Kim et al. ................. 349/129

FOREIGN PATENT DOCUMENTS

TW    1229442    3/2005
TW    1229447    3/2005

* cited by examiner

*Primary Examiner*—Thao X Le
*Assistant Examiner*—Ajay K Arora
(74) *Attorney, Agent, or Firm*—Jianq Chyun IP Office

(57) ABSTRACT

A pixel structure having a storage capacitor therein is provided. The pixel structure comprises a substrate, a first capacitor electrode, a capacitor dielectric layer, a second capacitor electrode, a passivation layer and a pixel electrode. The first capacitor electrode is disposed over the substrate. The capacitor dielectric layer is disposed over the first capacitor electrode. The second capacitor electrode is disposed over the capacitor dielectric layer. The second capacitor electrode has a protrusion protruding beyond the edge of the first capacitor electrode. The passivation layer is disposed over the second capacitor electrode. The passivation layer has an opening that exposes the second capacitor electrode. The pixel electrode is disposed over the passivation layer. The pixel electrode is electrically connected to the second capacitor electrode through the opening in the passivation layer.

5 Claims, 5 Drawing Sheets

THIN FILM TRANSISTORS ARRAY AND PIXEL STRUCTURE

CROSS-REFERENCE TO RELATED APPLICATION

This application claims the priority benefit of Taiwan application serial no. 93125452, filed on Aug. 26, 2004.

BACKGROUND OF THE INVENTION

1. Field of the Invention

The present invention relates to a thin film transistor array and pixel structure. More particularly, the present invention relates to a thin film transistor array and pixel structure having storage capacitors that can be easily repaired.

2. Description of the Related Art

The rapid development of multimedia systems come about as a result of the progress in manufacturing semiconductor devices and monitors. In the past, cathode ray tube (CRT) is the principal display device in the market because of their fine display quality and moderate price. However, due to the bulkiness of CRT and the environmental concerns regarding the production of hazardous radiation and the relatively high power consumption, it has been gradually phased out and replaced by more environmentally friendly display devices with a compact, slim and light body. One such display device is the thin film transistor liquid crystal display (TFT-LCD). Because of the high display quality, superior spatial utilization, low power consumption and radiation free operation characteristics, TFT-LCD has become one of the mainstream products in the market.

A conventional thin film transistor liquid crystal display (TFT-LCD) typically comprises a thin film transistor array, a color-filtering array and a liquid crystal layer. The thin film transistor array comprises an array of thin film transistors and a pixel electrode corresponding to each thin film transistor. Each thin film transistor serves as a switch for switching a liquid crystal display unit. In addition, each pixel unit is selected through a scan line and a data line. By applying a suitable operating voltage to the selected scan line and data line, a pixel data is displayed on the pixel unit. Furthermore, a portion of the pixel electrode will cover the scan line or a common line to form a storage capacitor. In the conventional technique, the most common storage capacitor can be categorized into the metal-insulator-metal (MIM) type and the metal-insulator-indium tin oxide (MII) type. The following is a more detailed description of these two types of storage capacitor structures.

FIG. 1 is a schematic cross-sectional view of a conventional metal-insulator-metal (MIM) type storage capacitor. As shown in FIG. 1, a storage capacitor having an MIM structure is formed through coupling a scan line or common line 100 with an upper electrode 120 on top. It should be noted that the scan line or the common line 100 is electrically isolated from the upper electrode 120 through a gate insulation layer 110. Hence, the capacitance (Cst) of the storage capacitor is related to the thickness of the gate insulation layer 110. In other words, the smaller the thickness of the gate insulation layer 110, the larger will be the capacitance (Cst) of the storage capacitor. In addition the pixel electrode 140 is electrically connected to the upper electrode 120 through a contact 132 in the passivation layer 130.

FIG. 2 is a schematic cross-sectional view of a conventional metal-insulator-ITO (MII) type storage capacitor. As shown in FIG. 2, a storage capacitor having an MII structure is formed through coupling a scan line or common line 200 with a pixel electrode 230 on top. One major difference from the MIM structure is that the scan line or common line 200 and the pixel electrode 230 in the storage capacitor having the MII structure are electrically insulated through a gate insulation layer 210 and a passivation layer 220. Hence, the capacitance (Cst) of the storage capacitor is related to the thickness of the gate insulation layer 210 and the passivation layer 220. In other words, the smaller the thickness of the gate insulation layer 210 and the passivation layer 220, the larger will be the capacitance of the storage capacitor (Cst).

In general, the capacitance (Cst) of a storage capacitor having the MIM structure is larger than the capacitance (Cst) of a storage capacitor having the MII structure. The principle reason is that the two metallic layers in the MIM structure are isolated from each other by a single gate insulation layer 110 while the two metallic layers in the MII structure are isolated from each other by a gate insulation layer 210 and a passivation layer 220.

Because the storage capacitor inside the pixel structures is used for retaining the voltage applied to various pixel units of a thin film transistor liquid crystal display (TFT-LCD), the display panel will have a better display quality when the capacitance (Cst) of the storage capacitor is large. Therefore, conventional TFT-LCD frequently deploys storage capacitors having a MIM structure.

Although a storage capacitor having a MIM structure has a larger capacitance, the production process often produces layers having defects such as micro-particle inclusions or voids that can impair the storage capacitor and produce defective dots.

SUMMARY OF THE INVENTION

Accordingly, the present invention is directed to provide a pixel structure having a storage capacitor such that any defective storage capacitor within the pixel structure can be easily repaired.

The present invention is directed to provide a thin film transistor array such that any defective storage capacitor within the thin film transistor array can be easily repaired.

As embodied and broadly described herein, the invention provides a pixel structure having a storage capacitor therein. The pixel structure comprises a first capacitor electrode, a capacitor dielectric layer, a second capacitor electrode, a passivation layer and a pixel electrode. The first capacitor electrode is disposed on a substrate. The capacitor dielectric layer is disposed on the first capacitor electrode. The second capacitor electrode is disposed on the capacitor dielectric layer. The second capacitor electrode has a protrusion protruding beyond the edge of the first capacitor electrode. The passivation layer is disposed on the second capacitor electrode. The passivation layer has an opening that exposes the second capacitor electrode. The pixel electrode is disposed on the passivation layer. The pixel electrode is electrically connected to the second capacitor electrode through the opening in the passivation layer.

According to one preferred embodiment of the present invention, the pixel electrode of the storage capacitor has at least a slit formed therein and located over the second capacitor electrode and the protrusion.

According to one preferred embodiment of the present invention, the pixel electrode of the storage capacitor is fabricated using indium-tin oxide or indium-zinc oxide.

The present invention also provides a thin film transistor array. The thin film transistor array comprises a substrate, a plurality of scan lines, a plurality of data lines, a plurality of thin film transistors, a plurality of upper electrodes and a plurality of pixel electrodes. The scan lines and the data lines are disposed on the substrate to define a plurality of pixel areas on the substrate. The thin film transistors are disposed inside corresponding pixel areas and are driven through corresponding scan line and data lines. The upper electrodes are disposed within various pixel areas above the scan lines. The upper electrode has a protrusion protruding beyond the edge of a corresponding scan line. The pixel electrode is disposed within a corresponding pixel area and electrically connected to a corresponding thin film transistor and upper electrode.

According to one preferred embodiment of the present invention, the thin film transistor array further comprises a passivation layer disposed between the pixel electrodes and the upper electrodes.

According to one preferred embodiment of the present invention, the thin film transistor array further comprises a dielectric layer disposed between the upper electrodes and the scan lines.

According to one preferred embodiment of the present invention, the thin film transistor array has at least a slit in each pixel electrode located over a corresponding upper electrode and a protrusion.

According to one preferred embodiment of the present invention, the pixel electrode in the thin film transistor array is fabricated using indium-tin oxide or indium-zinc oxide.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
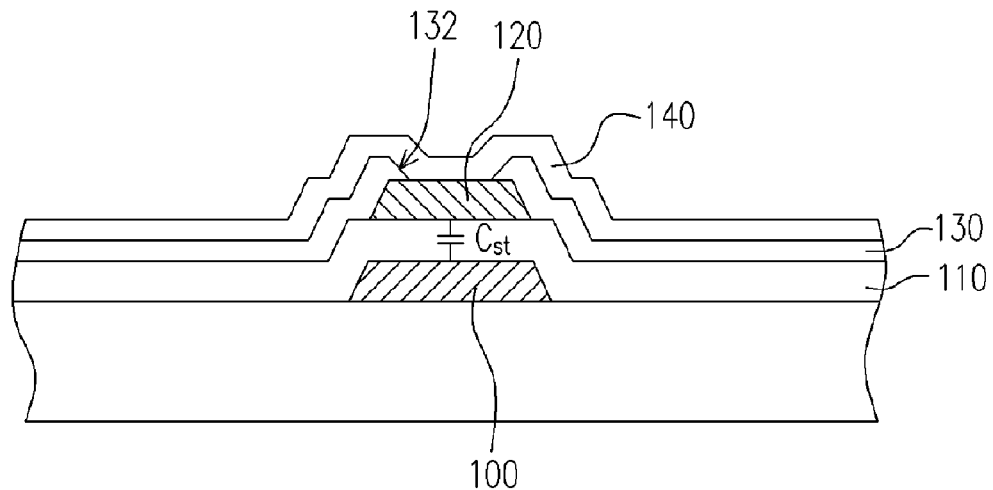
FIG. 1 is a schematic cross-sectional view of a conventional metal-insulator-metal (MIM) type storage capacitor.
Figure 2:
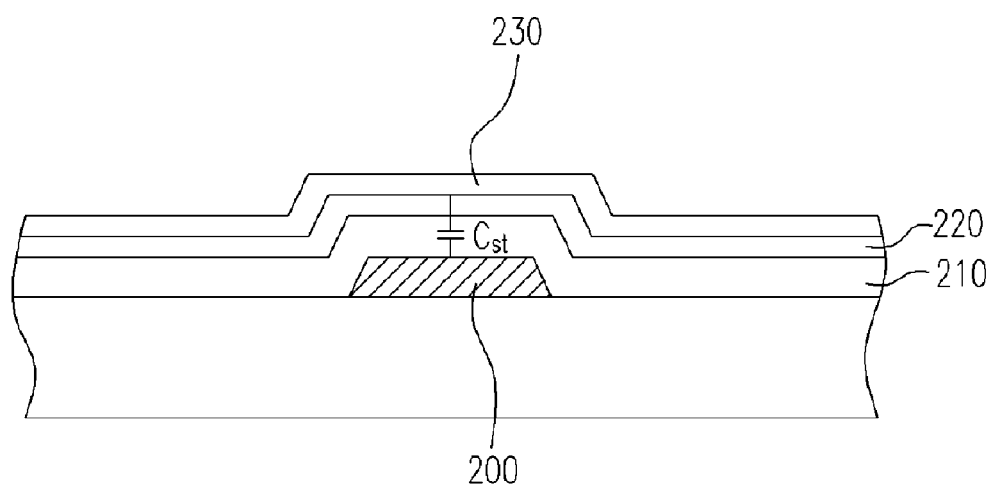
FIG. 2 is a schematic cross-sectional view of a conventional metal-insulator-ITO (MII) type storage capacitor.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
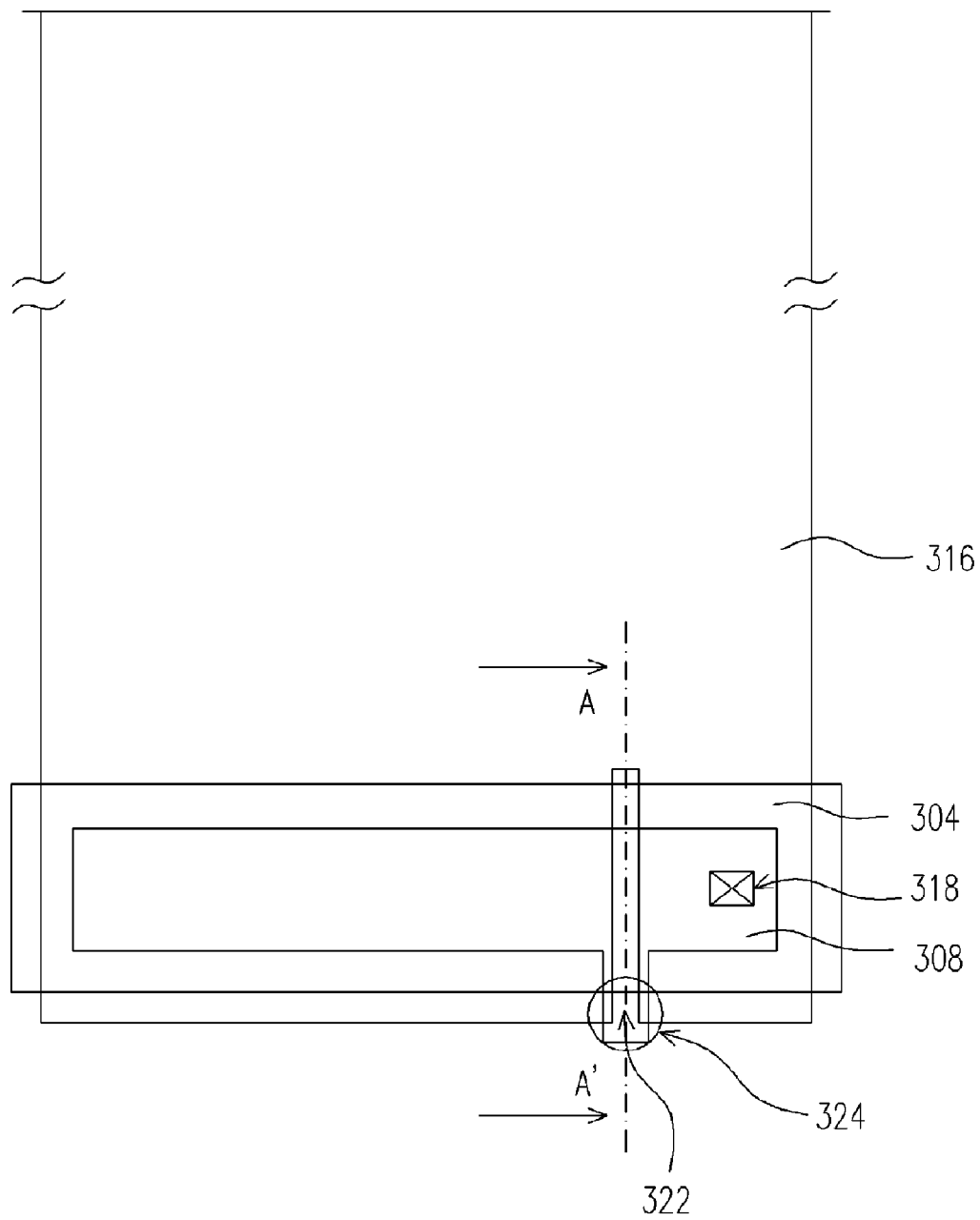
FIG. 3A is a top view showing a pixel structure having a storage capacitor according to a first preferred embodiment of the present invention.
Figure 4A:
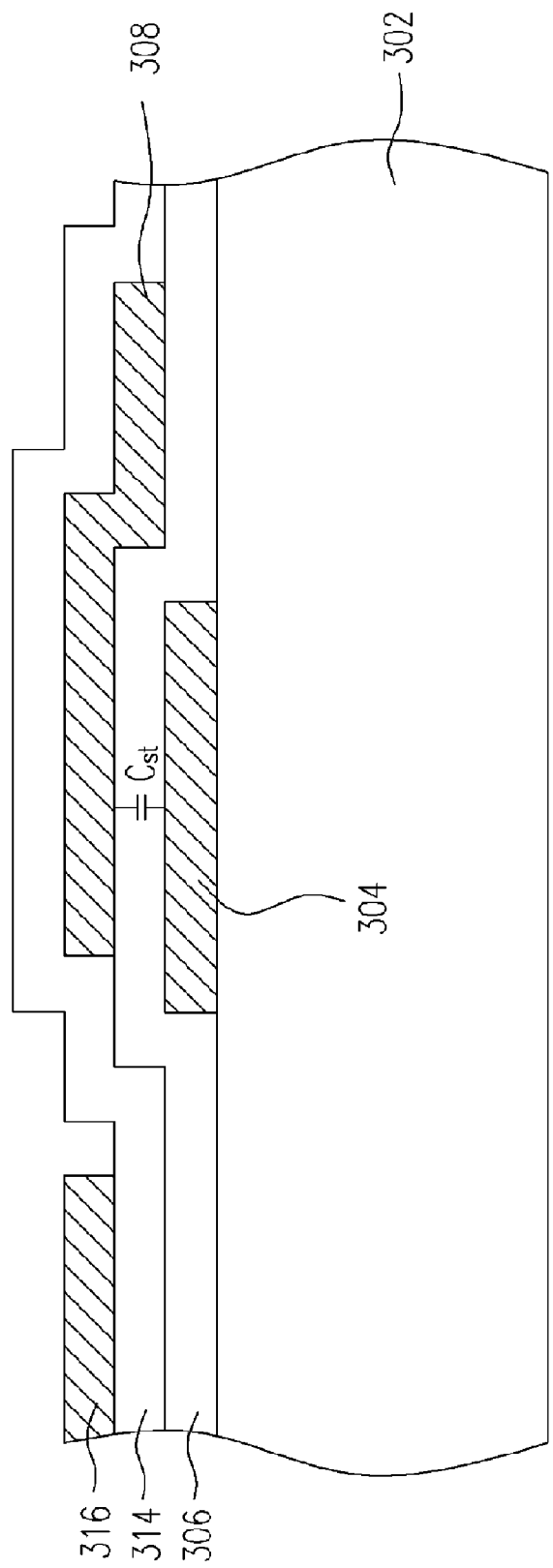
FIG. 4A is a schematic cross-sectional view along line A-A' of the pixel structure in FIG. 3A.

FIG. 3A is a top view showing a pixel structure having a storage capacitor according to a first preferred embodiment of the present invention. FIG. 4A is a schematic cross-sectional view along line A-A' of the pixel structure in FIG. 3A. As shown in FIGS. 3A and 4A, the present invention provides a pixel structure having a storage capacitor therein. The pixel structure comprises a first capacitor electrode 304, a capacitor dielectric layer 306, a second capacitor electrode 308, a passivation layer 314 and a pixel electrode 316. The first capacitor electrode 304 is disposed on a substrate 302. The capacitor dielectric layer 306 is disposed on the first capacitor electrode 304. The second capacitor electrode 308 is disposed on the capacitor dielectric layer 306. The second capacitor electrode 308 has a protrusion 324 protruding beyond the edge of the first capacitor electrode 304. The passivation layer 314 is disposed on the second capacitor electrode 308. The passivation layer 314 has an opening 318 that exposes the second capacitor electrode 308. The pixel electrode 316 is disposed on the passivation layer 314. The pixel electrode 316 is electrically connected to the second capacitor electrode 308 through the opening 318 in the passivation layer 314.

The pixel electrode 316 in each storage capacitor has at least a slit 322 disposed above the second capacitor electrode 308 and the protrusion 324. The pixel electrode 316 is fabricated using indium-tin oxide or indium-zinc oxide, for example.

Figure 3B:
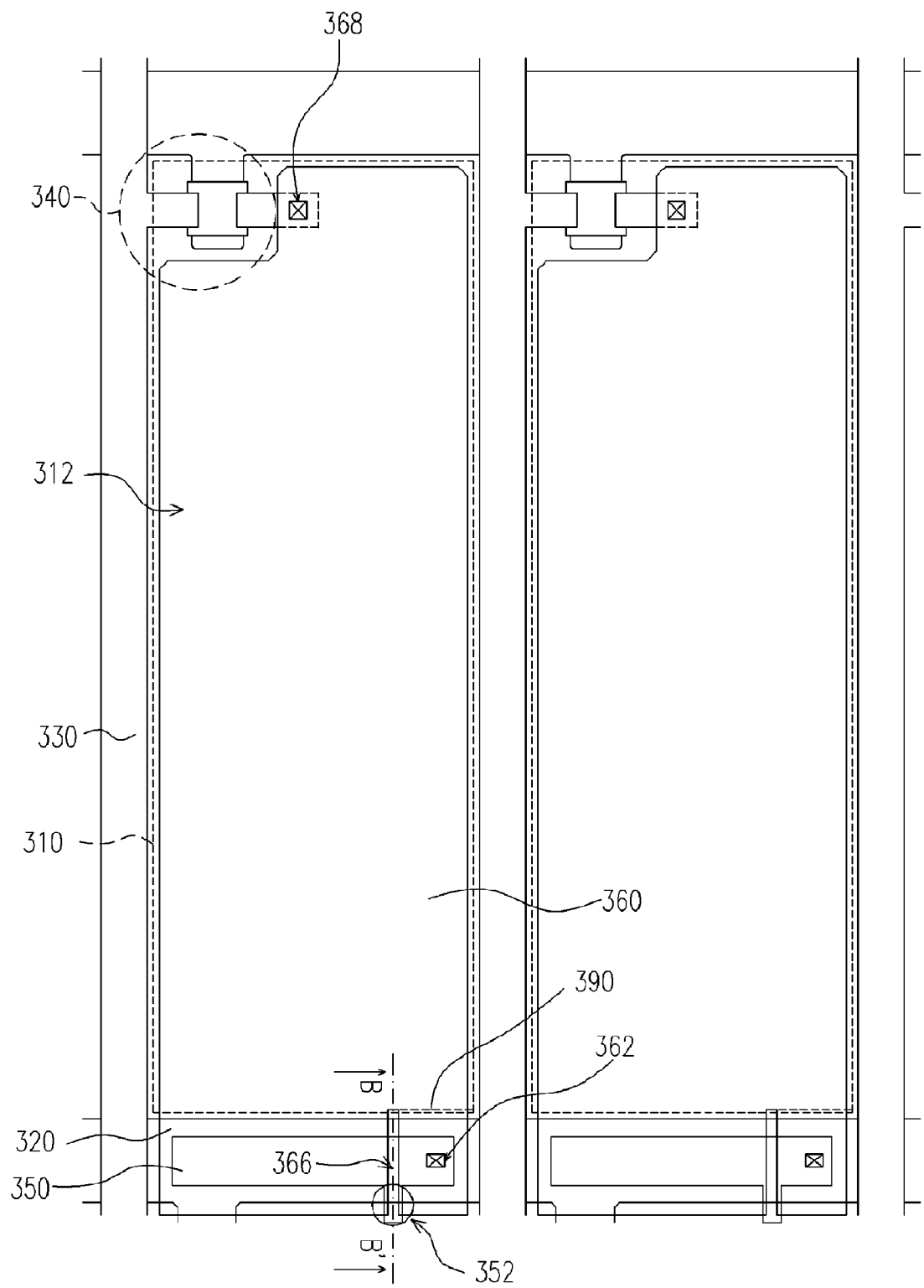
FIG. 3B is a top view showing a thin film transistor array according to the first preferred embodiment of the present invention.
Figure 4B:
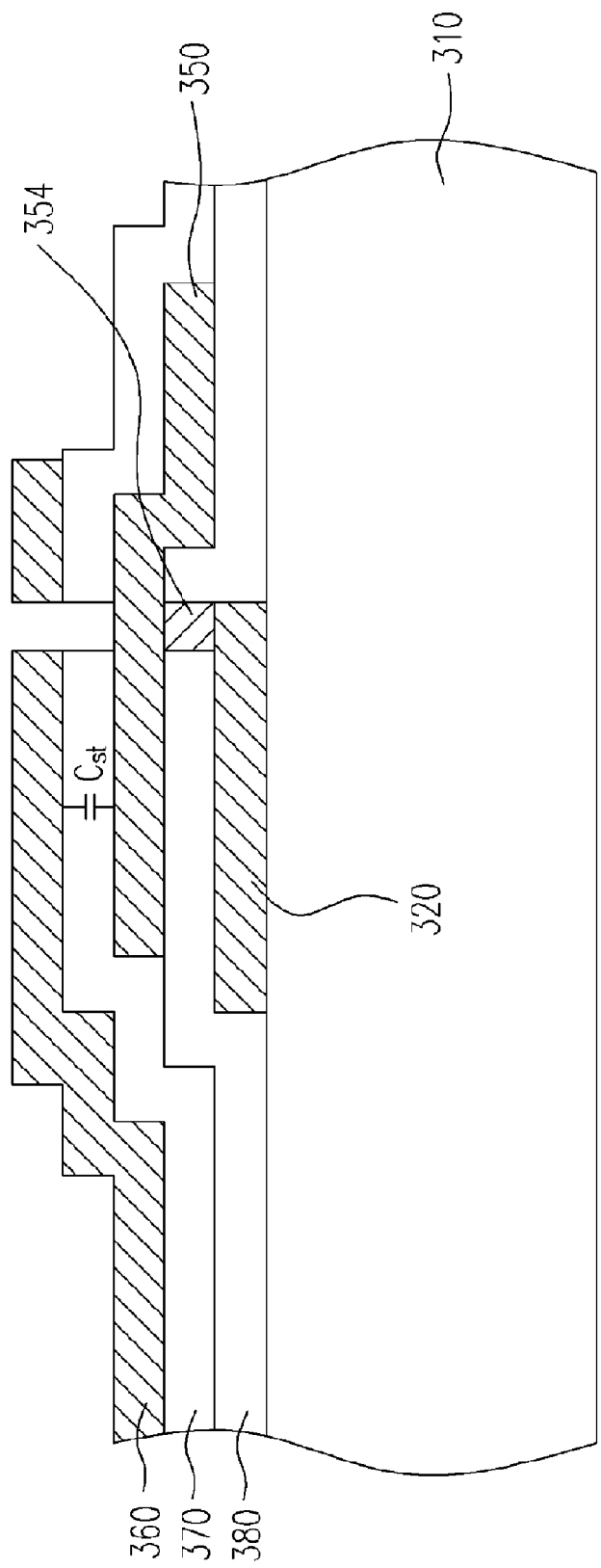
FIG. 4B is a schematic cross-sectional view along line B-B' of the thin film transistor array in FIG. 3B.

FIG. 3B is a top view showing a thin film transistor array according to the first preferred embodiment of the present invention. FIG. 4B is a schematic cross-sectional view along line B-B' of the thin film transistor array in FIG. 3B. As shown in FIGS. 3B and 4B, the thin film transistor array 300 of the present embodiment mainly comprises a substrate 310, a plurality of scan lines 320, a plurality of data lines 330, a plurality of thin film transistors 340, a plurality of upper electrodes 350 and a plurality of pixel electrodes 360.

In FIGS. 3B and 4B, the scan lines 320 and the data lines 330 are disposed on the substrate 310 so that a plurality of pixel areas 312 are defined on the substrate 310. The thin film transistors 340 are disposed inside the pixel areas. A corresponding scan line 320 and data line 330 drive each thin film transistor 340. The upper electrodes 350 are distributed inside various pixel areas. Each upper electrode 350 is disposed above a corresponding scan line 320. The upper electrode 350 has a protrusion 352 protruding beyond the edge of the corresponding scan line 320. The pixel electrodes 360 are disposed inside various pixel areas 312 and electrically connected to a corresponding thin film transistor 340 through an opening 368. The pixel electrode is fabricated using indium-tin oxide or indium-zinc oxide, for example.

The upper electrodes 350 are disposed between a corresponding pixel electrode 360 and a scan line 320. The upper electrodes 350 are formed together with the data lines 330 and the source/drain regions, for example. It should be noted that a passivation layer 370 could also be disposed between the upper electrodes 350 and the pixel electrodes 360. Furthermore, the passivation layer 370 has an opening 362 for electrically connecting the upper electrode 350 and a corresponding pixel electrode 360 together. In addition, a dielectric layer 380 is disposed between the upper electrodes 350 and the scan lines 320 for electrically isolating the upper electrodes 350 from corresponding scan lines.

The presence of particles or voids in the layer between an upper electrodes 350 and a corresponding scan lines 320 often leads to some charge leakage. Such leakage will affect the charging/discharging characteristic of the storage capacitor so that the display quality of the liquid crystal display device may deteriorate. Under these circumstances, the present embodiment permits the execution of a laser cutting operation along a cutting line 390 for removing the pixel electrode 360 close to the cutting line 390.

In the present embodiment, the pixel electrode 360 has a slit 366 formed therein. The slit is located above the upper electrode 350 and a portion of the protrusion 352. The slit 366 is designed to facilitate and speed up the laser repair operation.

As shown in FIG. 3B, before the thin film transistor array 300 undergoes any laser repair operation, the areas close to the slit 366 are more opaque regions. These less transparent region not only lead to a drop in the opening rate, but also lead to the leakage of light and a lowering of display contrast. In the present embodiment, the upper electrode 350 and the protrusion 352 are set to cover the slit 366 so that leakage is minimized and the display contrast is improved.

It should be noted that the laser only has to cut along the cutting line 390 and remove the pixel electrode 360 close to the cutting line 390 and isolate the pixel electrode 360 from the upper electrode 350 electrically in a repair operation due to the presence of a slit 366. In other words, the upper electrode 350 and the pixel electrode 360 are coupled to form a storage capacitor having a MII structure while the original storage capacitor constructed from the scan line 320 and the upper electrode 350 no longer exists.

As shown in FIG. 4B, particles or voids may still exist in the layer between the upper electrodes 350 and the scan lines 320. To prevent the particles and voids from affecting the charging/discharging characteristics of the storage capacitor having the MII structure, the upper electrode 350 and the scan line 320 are further bonded together to produce a conductive channel 354 connecting the upper electrode 350 and the scan line 320 electrically.

In summary, major advantages of the thin film transistor array of the present invention includes:

1. The thin film transistor array can be repaired with ease and flexibility.

2. Display contrast is improved because the thin film transistor array has a relatively low leakage rate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure electrically connected to a scan line and a data line, comprising:
   a substrate;
   a first capacitor electrode disposed on the substrate;
   a capacitor dielectric layer disposed on the first capacitor electrode;
   a second capacitor electrode disposed on the capacitor dielectric layer, wherein the second capacitor electrode has a protrusion protruding beyond the edge of the first capacitor electrode;
   a passivation layer, disposed on the second capacitor electrode, having an opening that exposes the second capacitor electrode; and
   a pixel electrode disposed on the passivation layer and electrically connected to the second capacitor electrode through the opening in the passivation layer, wherein the protrusion protrudes beyond the edge of the pixel electrode, the pixel electrode has at least a slit formed therein, the slit extends inward from the edge of the pixel electrode, the slit has an end portion near the scan line, and the end portion is completely shielded by the protrusion of the second capacitor electrode.

2. The pixel structure of claim 1, wherein a material of the pixel electrode comprises indium-tin oxide or indium-zinc oxide.

3. The pixel structure of claim 1, wherein the protrusion has strip shape and an extending direction of the slit is substantially parallel to an extending direction of the protrusion.

4. The pixel structure of claim 1, wherein a width of the protrusion is greater than a width of the slit.

5. The pixel structure of claim 1, wherein the protrusion is substantially aligned with the slit.

* * * * *